(12) United States Patent
Dhamdhere et al.

(10) Patent No.: US 9,966,941 B2
(45) Date of Patent: May 8, 2018

(54) WIDE INPUT RANGE, LOW OUTPUT VOLTAGE POWER SUPPLY

(71) Applicant: Texas Instruments Incorporated, Dallas, TX (US)

(72) Inventors: Vikrant Dhamdhere, Irvine, CA (US); Md Abidur Rahman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 274 days.

(21) Appl. No.: 14/817,666

(22) Filed: Aug. 4, 2015

(65) Prior Publication Data

US 2016/0036432 A1   Feb. 4, 2016

Related U.S. Application Data

(60) Provisional application No. 62/032,797, filed on Aug. 4, 2014.

(51) Int. Cl.
| | | |
|---|---|---|
| *G05F 1/00* | (2006.01) | |
| *H03K 17/30* | (2006.01) | |
| *G05F 1/595* | (2006.01) | |

(52) U.S. Cl.
CPC ........... *H03K 17/302* (2013.01); *G05F 1/595* (2013.01)

(58) Field of Classification Search
CPC ....... H02M 3/1584; H02M 2003/1586; H02M 2001/0045; H04B 2215/069; G05F 1/56; G05F 1/575; G05F 1/465; G05F 1/468; G05F 1/462; G05F 1/562; G05F 1/565
See application file for complete search history.

(56) References Cited

U.S. PATENT DOCUMENTS

| | | | | |
|---|---|---|---|---|
| 2013/0182357 A1* | 7/2013 | Brodsky | ............. | H01L 27/0281 361/56 |
| 2014/0340058 A1* | 11/2014 | Wang | ....................... | H02M 1/15 323/268 |
| 2015/0015223 A1* | 1/2015 | Chen | ....................... | G05F 1/575 323/280 |

* cited by examiner

*Primary Examiner* — Adolf Berhane
*Assistant Examiner* — Afework Demisse
(74) *Attorney, Agent, or Firm* — Lawrence J. Bassuk; Charles A. Brill; Frank D. Cimino

(57) ABSTRACT

This disclosure describes techniques for generating relatively low regulated power supply voltages over a relatively wide range of input voltages. The techniques for generating the regulated voltages may include using at least two different pass transistors to regulate an output voltage of a voltage regulator. Both the turn-on threshold voltage and the maximum drain-to-source voltage rating of the first pass transistor may be greater than the corresponding characteristics of the second pass transistor. Using two different pass transistors with two different turn-on threshold voltages and two different maximum drain-to-source voltage ratings may increase the range of voltages over which a voltage regulator can generate a relatively low output voltage relative to the range of voltages that would be allowable if a single type of pass transistor were used.

20 Claims, 2 Drawing Sheets

WIDE INPUT RANGE, LOW OUTPUT VOLTAGE POWER SUPPLY

This application claims the benefit of U.S. Provisional Application No. 62/032,797, filed Aug. 4, 2014, the entire content of which is incorporated herein by reference.

TECHNICAL FIELD

The disclosure relates to electrical circuits, and in particular, to power supply circuits.

BACKGROUND

On-chip power supplies are used to power a variety of circuits, such as, e.g., digital cores. An on-chip power supply may include a linear voltage regulator that uses a relatively large input voltage to generate a lower output voltage that is stable for use by a digital core. As the speeds of digital cores continue to increase, the supply voltages used by digital cores continue to decrease. Designing power-efficient power supplies for low-voltage digital cores and other types of low-voltage loads can present significant challenges.

SUMMARY

According to some aspects of this disclosure, an integrated circuit includes an input voltage lead. The integrated circuit further includes an output voltage lead. The integrated circuit further includes a first transistor having a first current path electrode coupled to the input voltage lead, a second current path electrode coupled to the output voltage lead, and a control electrode. The integrated circuit further includes a second transistor having a first current path electrode coupled to the input voltage lead, a second current path electrode coupled to the output voltage lead, and a control electrode. The integrated circuit further includes a control circuit having an input coupled to the output voltage lead, and an output coupled to the control electrodes of the first and second transistors. The second transistor has a turn-on threshold voltage that is less than a turn-on threshold voltage of the first transistor. The second transistor has a maximum drain-to-source voltage rating that is less than a maximum drain-to-source voltage rating of the first transistor.

According to additional aspects of this disclosure, a process includes regulating an output voltage of a voltage regulator using first and second pass transistors. The second pass transistor has a turn-on threshold voltage that is less than a turn-on threshold voltage of the first pass transistor. The second pass transistor has a maximum drain-to-source voltage rating that is less than maximum drain-to-source voltage rating of the first pass transistor.

According to additional aspects of this disclosure, a device includes circuitry configured to regulate an output voltage of a voltage regulator using first and second pass transistors. The second pass transistor has a turn-on threshold voltage that is less than a turn-on threshold voltage of the first pass transistor. The second pass transistor has a maximum drain-to-source voltage rating that is less than maximum drain-to-source voltage rating of the first pass transistor.

DETAILED DESCRIPTION

Figure 1:
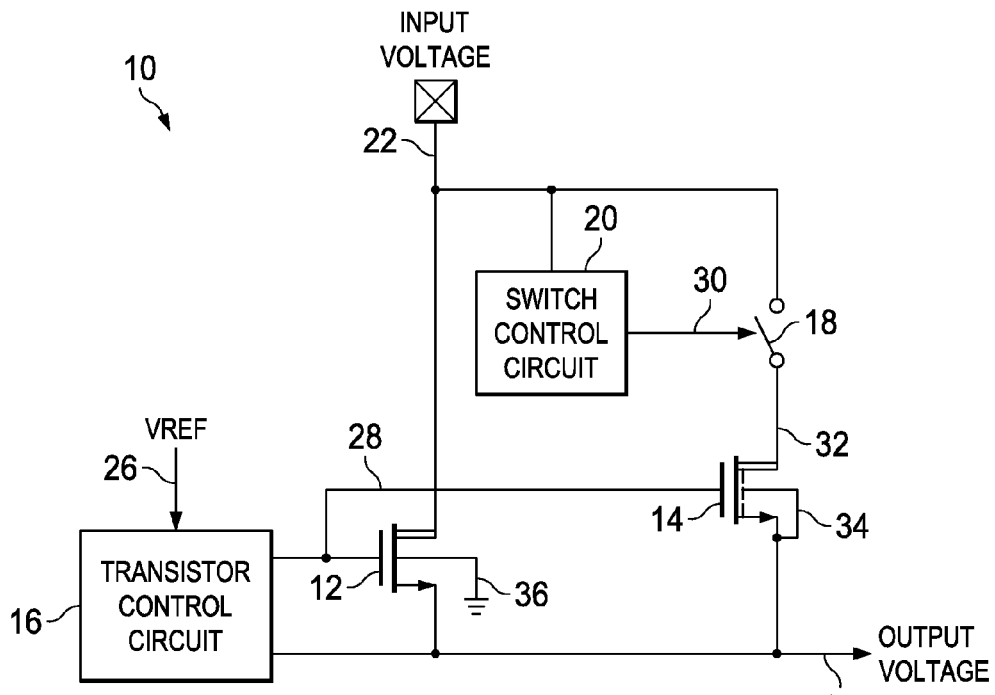
FIG. 1 is a block diagram illustrating an example voltage regulator according to this disclosure.

This disclosure describes techniques for generating relatively low regulated power supply voltages over a relatively wide range of input voltages. The techniques for generating the regulated voltages may include using at least two different pass transistors to regulate an output voltage of a voltage regulator. Both the turn-on threshold voltage and the maximum drain-to-source voltage rating of the first pass transistor may be greater than the corresponding characteristics of the second pass transistor.

Using two different pass transistors with two different turn-on threshold voltages and two different maximum drain-to-source voltage ratings may increase the range of voltages over which a voltage regulator can generate a relatively low output voltage relative to the range of voltages that would be allowable if a single type of pass transistor were used. In this way, a power supply may be obtained that generates relatively low regulated output voltages for a relatively wide range of input voltage levels.

For example, the relatively low turn-on threshold voltage of the second pass transistor may allow the second pass transistor to continue regulating the output voltage of a voltage regulator even when the input voltage of the voltage regulator is too low for the first pass transistor to turn on. Meanwhile, the relatively high maximum drain-to-source voltage rating of the first pass transistor may allow the first pass transistor to continue regulating the output voltage of the voltage regulator even when the input voltage of the voltage regulator is above the maximum drain-to-source voltage rating for the second pass transistor. As such, the two different types of pass transistors may operate together to increase the range of voltages over which the voltage regulator may regulate an output voltage relative to the range that would be achievable if only a single type of pass transistor were used.

During input voltage transients where the input voltage rapidly transitions from a relatively low voltage to a relatively high voltage, the first pass transistor may transition from an off state to an on state. Because the turn-on threshold voltage of the second pass transistor may be lower than the turn-on threshold voltage of the first pass transistor, the control loop and the second pass transistor may already be regulating the output voltage during the time period when the first pass transistor transitions from an off state to an on state. The regulation performed by the control loop and the second pass transistor may prevent voltage spikes from appearing at the voltage output that would otherwise occur due to startup delays in the control loop if the second pass transistor were not already turned on and regulating the output voltage. In this way, a voltage regulator may be achieved that has relatively high power supply rejection in the event of rapid low-to-high input voltage transitions.

In some examples, the first and second pass transistors may be n-type pass transistors (e.g., n-type metal-oxide-semiconductor field effect (NMOS) transistors and/or n-type drain extended NMOS (DENMOS) transistors). Using n-type transistors may provide better power supply rejection (PSR) and load regulation while also avoiding the need to use large Miller compensation capacitors, which might otherwise be needed if p-type pass transistors were used. However, n-type transistors may produce inferior drop-out voltages relative to p-type transistors with the same maximum drain-to-source voltage rating. Using multiple n-type transistors to regulate an output voltage may allow at least one of the n-type transistors to have a lower turn-on threshold voltage, which may in turn produce better drop-out voltages. Therefore, by using multiple n-type transistors with different turn-on threshold voltages to regulate the output voltage, the benefits associated with using an n-type transistor may be obtained (e.g., improved PSR and load regulation, avoiding bulky Miller compensation capacitors, and/or smaller area pass transistor) while at the same time reducing or altogether avoiding the typical increase in dropout voltage associated with using a single n-type pass transistor.

In some examples, a switch may selectively decouple the second pass transistor (which has the relatively low turn-on threshold voltage) from the input voltage of the voltage regulator for relatively high input voltages. This may prevent the second pass transistor from breaking down due to high input voltages that exceed the maximum drain-to-source rating of the transistor, while still allowing the second pass transistor to assist in regulating the output voltage at relatively low input voltages. In this way, a relatively-low turn-on threshold voltage transistor may be used for regulating voltages in a wide-input voltage regulator, without requiring the transistor to have a prohibitively large maximum drain-to-source voltage rating.

In some examples, the threshold voltage above which the second pass transistor is decoupled from the input voltage of the voltage regulator may be greater than the minimum input voltage that is needed to keep the first pass transistor turned on. This may allow the control loop to continuously control and regulate the gates of the first and second pass transistors when the first pass transistor turns on, thereby preventing voltage spikes from appearing at the voltage output that would otherwise occur due to startup delays in the control loop if the second pass transistor were not turned on.

In some examples, one or more zener diodes may be used to detect whether the input voltage is greater than or less than the threshold voltage that is used to selectively decouple the second pass transistor. Using one or more zener diodes for voltage detection may allow voltage detection to be performed without requiring the use of a reference voltage-based comparator, thereby reducing the power consumption of the voltage regulator and avoiding risks associated with threshold variations in comparator-controlled regulators.

In some examples, the first pass transistor may be a non-isolated n-type transistor. A non-isolated n-type transistor may refer to an n-type transistor where the back gate electrode is coupled to a ground electrode for the circuit instead of being coupled to the source electrode of the transistor. Using a non-isolated high voltage n-type pass transistor may reduce the number of masks that need to be used when manufacturing the circuit, thereby saving manufacturing costs. However, because the back gate and source electrodes of the transistor are not connected to each other, the body effect may increase the turn-on the threshold voltage of the transistor, which may in turn cause the transistor to turn on at higher input voltages.

Turning on the pass transistor at higher input voltages may increase the dropout voltage of the regulator if just a single pass transistor were used. However, the techniques of this disclosure may use a second pass transistor that has a relatively low-threshold voltage to regulate the output voltage even when the first pass transistor is turned off. In this way, the benefits associated with using a non-isolated n-type pass transistor may be obtained (e.g., lower manufacturing costs) while at the same time avoiding the increase in dropout voltage that would occur if merely a single, non-isolated n-type pass transistor were used.

In some examples, a low dropout regulator (LDO) regulation loop may use a non-isolated high voltage DENMOS pass transistor in parallel with an isolated low voltage DENMOS pass transistor with a supply voltage monitoring switch to cutoff the low voltage DENMOS when the supply voltage is too high. Using a non-isolated high voltage DENMOS in parallel with an isolated low voltage DENMOS may reduce the number of process masks required to manufacture an integrated circuit that includes the voltage regulator, thereby reducing the cost of manufacturing the circuit.

In some examples, during a power supply ramp from a relatively low value to high value, the pass transistors in the voltage regulator may both be operating in the regulation loop for a particular range of supply voltages. In other words, the range of input supply voltages for which each of the pass transistors is in the regulation loop may be overlapping. When the supply voltage is high enough (e.g., less than the maximum allowable drain-to-source voltage for the second transistor), then the voltage regulator may switch off the second pass transistor from the regulation loop. In this way, a voltage regulator may be achieved that has relatively high power supply rejection in the event of a rapid low-to-high input voltage transition.

A metal-oxide-semiconductor field effect (MOSFET) transistor may have a maximum specified drain-to-source voltage above which the transistor may breakdown. Devices designed to withstand greater drain-to-source voltages typically have higher turn-on threshold voltages. Higher turn-on threshold voltages may prevent an n-type MOSFET (NMOS) from working as a pass device in low dropout situations. Replacing the NMOS pass transistor with a p-type MOSFET (PMOS) pass transistor may work for low dropout situations, but will result in inferior power supply rejection (PSR) and inferior load regulation. Also a PMOS pass transistor may require more complex compensation (e.g., Miller compensation), which may require extra masks and/or be area inefficient.

One way to deal with low dropouts situations is to use both an NMOS pass transistor and a PMOS bypass transistor, and turn on the PMOS bypass transistor for low input voltages. However, large voltage spikes may occur at the output when the input voltage rapidly transitions from a low voltage to a high voltage due to delays in turning off the PMOS transistor and due to delays in the start-up of the voltage regulation loop.

The techniques of this disclosure may use two different pass transistors with two different turn-on threshold voltages and two different maximum drain-to-source voltage ratings to regulate the output voltage of a voltage regulator. The pass transistor with the lower turn-on threshold voltage may regulate the output voltage of the voltage regulator even in cases where the pass transistor with the larger turn-on threshold voltage is turned off, thereby allowing relatively low output voltage regulation with an NMOS pass transistor. Further, the pass transistor with the lower turn-on threshold voltage may continue to regulate the output voltage at time periods when the pass transistor with the larger turn-on threshold voltage transitions from an off state to an on state, thereby avoiding large voltage spikes that may otherwise occur at the output when the input voltage rapidly transitions from a low to a high voltage. In some cases, a switch may decouple the pass transistor with the lower turn-on threshold voltage from the input voltage of the voltage regulator when the input voltage is above a threshold, thereby preventing the pass transistor from exceeding its relatively low maximum drain-to-source voltage rating. In this way, a power supply may be achieved that generates relatively low regulated voltages for a relatively wide range of input voltage levels.

FIG. 1 is a block diagram illustrating an example voltage regulator 10 according to this disclosure. Voltage regulator 10 includes pass transistors 12, 14, a transistor control circuit 16, a switch 18, a switch control circuit 20, an input voltage lead 22, an output voltage lead 24, a reference voltage lead 26, conductors 28, 30, 32, 34, and a ground conductor 36.

Source electrodes of pass transistors 12, 14 are coupled to output voltage lead 24. A drain electrode of pass transistor 12 is coupled to input voltage lead 22. A drain electrode of pass transistor 14 is coupled to switch 18 via conductor 32. A back gate electrode of pass transistor 12 is coupled to ground conductor 36. A back gate electrode of pass transistor 14 is coupled to a source electrode of pass transistor 14 via conductor 34. A feedback input of transistor control circuit 16 is coupled to output voltage lead 24 and to the sources of pass transistors 12, 14. A reference voltage input of transistor control circuit 16 is coupled to reference voltage lead 26. An output of transistor control circuit 16 is coupled to the gates of pass transistors 12, 14 via conductor 28. An input of switch control circuit 20 is coupled to input voltage lead 22. An output of switch control circuit 20 is coupled to switch 18 via conductor 30. A first current path electrode of switch 18 is coupled to input voltage lead 22. A second current path electrode of switch 18 is coupled to the drain of transistor 14 via conductor 32.

In the example voltage regulator 10 of FIG. 1, pass transistors 12, 14 are metal metal-oxide-semiconductor field effect (MOSFET) transistors, and more specifically n-type MOSFET (NMOS) transistors, and more specifically drain extended NMOS (DENMOS) transistors. Pass transistor 12 is an isolated DENMOS transistor, and pass transistor 14 is a non-isolated DENMOS transistor. An isolated transistor may refer to a transistor where the back gate electrode is coupled to the source terminal of the transistor. A non-isolated transistor may refer to a transistor where the back gate electrode is not coupled to the source electrode of the transistor, but is instead coupled to a ground conductor for the circuit. In other examples, pass transistors 12, 14 may be other combinations of isolated and non-isolated transistors as well as other types of transistors having the same or different conductivities.

Pass transistors 12, 14 may each have a maximum drain-to-source voltage rating, and a turn-on threshold voltage. The maximum drain-to-source voltage rating for a transistor may refer to a specified maximum drain-to-source voltage that the transistor is designed to handle without causing breakdown. A drain-to-source voltage may refer to the voltage between the drain and source electrodes of the transistor. The turn-on threshold voltage for a transistor may refer to a minimum gate-to-source voltage that is needed to turn on the transistor (i.e., to create a current conduction path between the source and drain terminals of the transistor).

In the example voltage regulator 10 of FIG. 1, pass transistor 12 may have a maximum drain-to-source voltage rating that is greater than the maximum drain-to-source voltage rating of pass transistor 14. In some examples, the maximum drain-to-source voltage rating of pass transistor 12 may be at least 1.5 times greater than the maximum drain-to-source voltage rating of pass transistor 14, and more particularly at least 2.0 times greater than the maximum drain-to-source voltage rating of pass transistor 14, and more particularly at least 2.5 times greater than the maximum drain-to-source voltage rating of pass transistor 14. In a specific example, the maximum drain-to-source voltage rating of pass transistor 12 may be 20 volts (V), and the maximum drain-to-source voltage rating of pass transistor 14 may be 7 V. In some examples, the maximum drain-to-source voltage rating of pass transistor 14 may be less than the maximum input voltage that voltage regulator 10 is designed to support.

Pass transistor 12 may have a turn-on threshold voltage that is greater than the turn-on threshold voltage of pass transistor 14. In some examples, the turn-on threshold voltage of pass transistor 12 may be at least 2 times greater than the turn-on threshold voltage of pass transistor 14, and more particularly 3 times greater than the turn-on threshold voltage of pass transistor 14, and more particularly at least 3.5 times greater than the turn-on threshold voltage of pass transistor 14. In a specific example, the turn-on threshold voltage of pass transistor 12 may be approximately 0.58 volts (V) at room temperature, and the turn-on threshold voltage of pass transistor 14 may be approximately 0.15 V at room temperature. In some examples, the turn-on threshold voltage of pass transistor 12 may be greater than the minimum turn-on threshold voltage that is needed to regulate the output voltage of voltage regulator 10 when voltage regulator 10 is supplied with the minimum input voltage that voltage regulator 10 is designed to support.

During operation, input voltage lead 22 may form a voltage input for voltage regulator 10 that is configured to receive an input voltage. Output voltage lead 24 may form a voltage output for voltage regulator 10 that is configured to output a regulated output voltage. Voltage regulator 10 may generate a regulated output voltage at output voltage lead 24 based on the input voltage at input voltage lead 22 and based on a reference voltage carried by reference voltage lead 26.

In general, the regulated output voltage produced by voltage regulator 10 may be substantially constant over a wide range of input voltages and over a wide range of load impedances. Pass transistors 12, 14 may act as pass transistors that, when turned-on, pass current between the input and output of voltage regulator 10. Transistor control circuit 16 may act as a control loop (e.g., feedback loop) that controls the gates of pass transistors 12, 14 to regulate the output voltage produced at output voltage lead 24. The amount of current passed by each of pass transistors 12, 14 may be determined based on the control voltage produced by transistor control circuit 16.

Specifically, transistor control circuit 16 receives the output voltage of voltage regulator 10 via output voltage lead 24 and a reference voltage via reference voltage lead 26, and generates a control voltage based on the output voltage and the reference voltage. Transistor control circuit 16 outputs the output voltage via conductor 28. Each of pass transistors 12, 14 may receive the control voltage at a gate electrode of the respective transistor, and adjust the amount of current produced at a source electrode of the respective transistor based on the control voltage.

Transistor control circuit 16 may generate the control voltage such that the control voltage causes pass transistors 12, 14 to produce currents that regulate the output voltage of voltage regulator 10 at a target output voltage. Regulating the output voltage of voltage regulator 10 at a target output voltage may refer to causing the output voltage of voltage regulator 10 to be substantially equal to the target output voltage over a range of load impedance (or resistance) conditions and/or over a range of input voltages.

For example, if the load impedance were to decrease, the output voltage of voltage regulator 10 may decrease to a voltage that is lower than the target output voltage. In response to the decrease in output voltage, transistor control circuit 16 may increase the control voltage so as to cause one or both of pass transistors 12, 14 to increase the currents produced at their respective source electrodes. Increasing the currents produced at the source electrodes may increase the output voltage of voltage regulator 10 back to the target output voltage, thereby compensating for the change in load impedance. The opposite behavior may occur when the load impedance increases. In this way, the output load current may be adjusted and/or regulated by controlling the gate voltages of one or both of pass transistors 12, 14.

Switch control circuit 20 may receive the input voltage of voltage regulator 10 via input voltage lead 22, generate a switch control signal, and output the switch control signal to switch 18 via conductor 30. Switch 18 may receive the switch control signal via conductor 30, and selectively couple (e.g., connect) the drain electrode of transistor 14 to input voltage lead 22 based on the switch control signal.

Switch control circuit 20 may generate the switch control signal such that the signal causes switch 18 to couple (e.g., connect) the drain electrode of transistor 14 to input voltage lead 22 when the input voltage is greater than a threshold voltage, and decouple (e.g., disconnect) the drain electrode of transistor 14 from input voltage lead 22 when the input voltage is less than the threshold voltage. When switch 18 couples the drain electrode of transistor 14 to input voltage lead 22, switch 18 may be said to be turned on. Similarly, when switch 18 decouples the drain electrode of transistor 14 to input voltage lead 22, switch 18 may be said to be turned off. When switch 18 is turned on, a current path may be formed between input voltage lead 22 and conductor 32 that allows current flow through switch 18, thereby allowing current to flow through transistor 14. When switch 18 is turned off an open circuit may be formed between input voltage lead 22 and conductor 32, thereby preventing current from flowing through transistor 14. In some examples, the threshold voltage used to control switch 18 may be greater than the input voltage that is needed to turn on pass transistor 12.

In order for each of pass transistors 12, 14 to conduct a current, the gate-to-source voltage of the respective transistor may need to be greater than a turn-on threshold voltage. The gate-to-source voltage of a transistor may refer to the difference between the voltage at the gate electrode of the transistor and the voltage at the source electrode of the transistor. When the gate-to-source voltage of a transistor is greater than the turn-on threshold voltage of the transistor, then the transistor may be said to be turned on, and a current conduction path may be formed between the current path electrodes of the transistor. Similarly, when the gate-to-source voltage of a transistor is less than the turn-on threshold voltage of the transistor, then the transistor may be said to be turned off, and a current conduction path may not formed between the current path electrodes of the transistor.

In this example voltage regulator 10 of FIG. 1, the gate-to-source voltage corresponds to the difference between the control voltage carried by conductor 28 and the output voltage carried by output voltage lead 24. As the input voltage for voltage regulator 10 decreases, the maximum control voltage that can be produced by transistor control circuit 16 may also decrease.

For relatively low input voltages, the maximum control voltage produced by transistor control circuit 16 may decrease to a level that is not sufficient to keep pass transistor 12 turned on. As such, pass transistor 12 may be turned off. However, for relatively low input voltages, switch control circuit 20 may turn on switch 18, thereby allowing current to flow through pass transistor 14. As discussed above, pass transistor 14 may have a turn-on threshold voltage that is less than the turn-on threshold voltage of pass transistor 12. As such, even though pass transistor 12 is turned off, pass transistor 14 may continue to regulate the output voltage, thereby allowing voltage regulator 10 to continue regulating the output voltage at relatively low input voltages.

For relatively high input voltages, the input voltage may be greater than the maximum drain-to-source voltage rating of pass transistor 14. As such, switch control circuit 20 may turn off switch 18, thereby preventing the relatively high input voltage from causing pass transistor 14 to breakdown. However, pass transistor 12 may have a maximum drain-to-source voltage rating that is greater than that of pass transistor 14. Therefore, pass transistor 12 may continue to regulate the output voltage, even though pass transistor 14 may be turned off.

In some examples, the threshold voltage used by switch control circuit 20 to control switch 18 may be greater than the input voltage needed to turn on pass transistor 12. In such examples, for input voltages that are less than the threshold voltage used by switch control circuit 20 to control switch 18, but greater than the input voltage needed to turn on pass transistor 12, both pass transistors 12, 14 may be turned on and collectively regulate the output voltage.

As shown in FIG. 1, at least two different pass transistors 12, 14 are used to regulate an output voltage of voltage regulator 10. Both the turn-on threshold voltage and the maximum drain-to-source voltage rating of pass transistor 12 may be greater than the corresponding characteristics of pass transistor 14. Using two different pass transistors 12, 14 with two different turn-on threshold voltages and two different maximum drain-to-source voltage ratings may increase the range of voltages over which voltage regulator 10 can generate a relatively low output voltage relative to the range of voltages that would be allowable if a single type of pass transistor were used.

For example, the relatively low turn-on threshold voltage of pass transistor 14 may allow pass transistor 14 to continue regulating the output voltage of voltage regulator 10 even when the input voltage of voltage regulator 10 is too low for pass transistor 12 to turn on. Meanwhile, the relatively high maximum drain-to-source voltage rating of pass transistor 12 may allow pass transistor 12 to continue regulating the output voltage of voltage regulator 10 even when the input voltage of voltage regulator 10 is above the maximum drain-to-source voltage rating for pass transistor 14. As such, the two different types of pass transistors may operate together to increase the range of voltages over which voltage regulator 10 may regulate an output voltage relative to the range of voltages that would be achievable if only a single type of pass transistor were used. In this way, voltage regulator 10 may generate relatively low regulated voltages for a relatively wide range of input voltage levels.

During input voltage transients where the input voltage rapidly transitions from a relatively low voltage to a relatively high voltage, pass transistor 12 may transition from an off state to an on state. Because the turn-on threshold voltage of pass transistor 14 may be lower than the turn-on threshold voltage of pass transistor 12, the control loop formed by transistor control circuit 16 and pass transistor 14 may already be regulating the output voltage during the time period when pass transistor 12 transitions from an off state to an on state. The regulation performed by transistor control circuit 16 and pass transistor 14 may prevent voltage spikes from appearing at the voltage output that would otherwise occur due to startup delays in the control loop if pass transistor 14 were not already turned on and regulating the output voltage. In other words, for an input voltage transient from low to high, voltage regulator 10 may turn off pass transistor 14 after pass transistor 12 is fully on and in regulation, and this overlap in operation may help to prevent an output voltage spike. In this way, a voltage regulator 10 may be achieved that has relatively high power supply rejection in the event of relatively rapid low-to-high input voltage transitions.

In some examples, pass transistors 12, 14 may be n-type pass transistors (e.g., n-type metal-oxide-semiconductor (NMOS) transistors and/or n-type drain extended NMOS (DENMOS) transistors). Using n-type transistors may provide better power supply rejection (PSR) and load regulation while also avoiding the need to use large Miller compensation capacitors, which might otherwise be needed if p-type pass transistors were used. However, n-type transistors may produce inferior drop-out voltages relative to p-type transistors with the same maximum drain-to-source voltage rating. Using multiple n-type transistors to regulate an output voltage may allow at least one of the n-type transistors to have a lower turn-on threshold voltage, which may in turn produce better drop-out voltages. Therefore, by using multiple n-type transistors with different turn-on threshold voltages to regulate the output voltage, the benefits associated with using n-type transistors may be obtained (e.g., improved PSR and load regulation, avoiding bulky Miller compensation capacitors, and/or smaller area pass transistor) while at the same time reducing or altogether avoiding the typical increase in dropout voltage associated with using a single n-type pass transistor.

In general, relatively low turn-on threshold voltage transistors may also have relatively low maximum drain-to-source voltages. Specifically, the maximum drain-to-source voltage rating of pass transistor 14 may be less than the maximum input voltage that voltage regulator 10 is designed to support. In order to avoid applying a voltage across pass transistor 14 that is greater than the maximum drain-to-source voltage rating of pass transistor 14, switch control circuit 20 may cause switch 18 to selectively decouple pass transistor 14 (e.g. the drain electrode of pass transistor 14) from input voltage lead 22 when the input voltage is relatively high (e.g., greater than a threshold voltage). When the input voltage is relatively low (e.g., less than the threshold voltage), switch control circuit 20 may cause switch 18 to couple the pass transistor 14 to input voltage lead 22.

Selectively decoupling pass transistor 14 from the input voltage lead for relatively high input voltages may prevent pass transistor 14 from breaking down due to high input voltages that exceed the maximum drain-to-source rating of the transistor, while still allowing pass transistor 14 to assist in regulating the output voltage at relatively low input voltages. In this way, a relatively-low turn-on threshold voltage transistor may be used for regulating voltages in a wide-input voltage regulator, without requiring the transistor to have a prohibitively large maximum drain-to-source voltage rating.

In some examples, the threshold voltage above which pass transistor 14 is decoupled from the input voltage lead 22 may be greater than the minimum input voltage that is needed to keep pass transistor 12 turned on. This may allow transistor control circuit 16 to continuously control and regulate the output voltage when pass transistor 12 turns on, thereby preventing voltage spikes from appearing at the voltage output that would otherwise occur due to startup delays in the control loop if pass transistor 14 were not already turned on at the time that pass transistor 12 turns on.

In some examples, switch control circuit 20 may use one or more zener diodes to detect whether the input voltage is greater than or less than the voltage threshold that is used to control switch 18. In this way, switch control circuit 20 may perform voltage detection without requiring the use of a reference voltage-based comparator, thereby reducing the power consumption of the voltage regulator and avoiding risks associated with threshold variations in comparator-controlled regulators.

As shown in FIG. 1, pass transistor 12 is a non-isolated n-type transistor. Using a non-isolated n-type pass transistor may reduce the number of masks that need to be used when manufacturing voltage regulator 10, thereby saving manufacturing costs. However, because the back gate and source electrodes of pass transistor 12 are not connected to each other, the body effect may increase the turn-on the threshold voltage of pass transistor 12, which may in turn cause pass transistor 12 to turn off at higher input voltages than a corresponding isolated transistor. Turning off pass transistor 12 at higher input voltages may increase the dropout voltage of the regulator if merely a single pass transistor were used. However, because voltage regulator 10 uses pass transistor 14 (which has a relatively low-threshold voltage) to regulate the output voltage even when pass transistor 12 is turned off, the benefits associated with using a non-isolated n-type transistor may be obtained (e.g., lower manufacturing costs) while at the same time avoiding the increase in dropout voltage that would occur if merely a single, non-isolated pass transistor were used.

Figure 2:
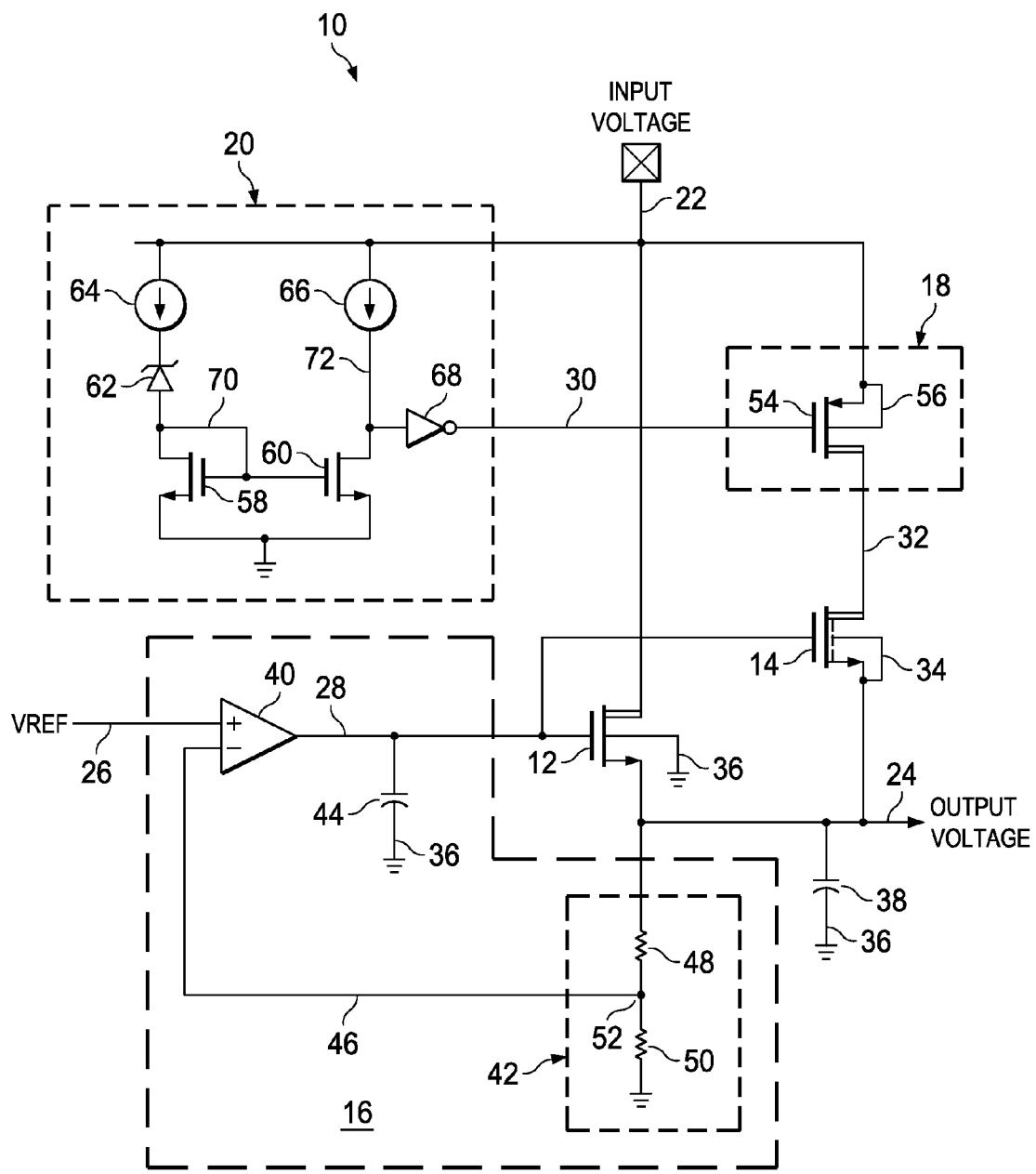
FIG. 2 is a block diagram illustrating an example voltage regulator that may be used to implement the voltage regulator of FIG. 1.

FIG. 2 is a block diagram illustrating an example voltage regulator 10 that may be used to implement the voltage regulator 10 of FIG. 1. Same or similar components between FIGS. 1 and 2 have been numbered with identical reference numerals.

Voltage regulator 10 includes pass transistors 12, 14, a transistor control circuit 16, a switch 18, a switch control circuit 20, an input voltage lead 22, an output voltage lead 24, a reference voltage lead 26, conductors 28, 30, 32, 34, ground conductors 36, and a capacitor 38. The components in voltage regulator 10 of FIG. 2 are arranged in a similar configuration to voltage regulator 10 in FIG. 1 except that capacitor 38 has been added and additional detail has been provided for example implementations of various components. Capacitor 38 is coupled between output voltage lead 24 and ground conductor 36.

Transistor control circuit 16 includes an amplifier 40, a feedback circuit 42, a capacitor 44, and a conductor 46. An input of feedback circuit 42 is coupled to output voltage lead 24. An output of feedback circuit 42 is coupled to an inverting input of amplifier 40 via conductor 46. A non-inverting input of amplifier 40 is coupled to reference voltage lead 26. An output of amplifier 40 is coupled to the gates of pass transistors 12, 14. Capacitor 38 is coupled between the output of amplifier 40 and ground conductor 36. Capacitor 38 may act as a decoupling capacitor.

Feedback circuit 42 includes resistors 48, 50, and a node 52. Resistor 48 is coupled between output voltage lead 24 and node 52. Resistor 50 is coupled between node 52 and ground conductor 36.

Switch 18 includes transistor 54. A gate electrode of transistor 54 is coupled to an output of switch control circuit 20 via conductor 30. A source electrode of transistor 54 is coupled to input voltage lead 22. A drain electrode of transistor 54 is coupled to a drain electrode of pass transistor 14 via conductor 32. A back gate electrode of transistor 54 is coupled to the source electrode of transistor 54 via conductor 56.

Switch control circuit 20 includes transistors 58, 60, a zener diode 62, current sources 64, 66, an inverter 68, and conductors 70, 72. The sources of transistors 58, 60 are coupled to each other, both of which are coupled to a ground conductor 36. The gates of transistors 58, 60 are coupled to each other. The drain of transistor 58 is coupled to the gate of transistor 58 via conductor 70. The drain of transistor 58 is coupled to an anode of zener diode 62. A cathode of zener diode 62 is coupled to a current output terminal of current source 64. A supply terminal of current source 64 is coupled to input voltage lead 22. A drain of transistor 60 is coupled to an output current terminal of current source 66 and to an input of inverter 68 via conductor 72. A supply terminal of current source 66 is coupled to input voltage lead 22. An output of inverter 68 is coupled to the gate of transistor 54 via conductor 30.

Feedback circuit 42 may form a voltage divider. Feedback circuit 42 receives the output voltage of voltage regulator 10 via output voltage lead 24, generates a voltage-divided voltage, and outputs the voltage-divided voltage at node 52 via conductor 46. The voltage-divided voltage may be proportional to the output voltage. For example, the voltage-divided voltage may be equal to the output voltage divided by a voltage division factor.

Amplifier 40 receives the voltage-divided voltage via conductor 46, receives a reference voltage via reference voltage lead 26, generates a control voltage based on the voltage-divided voltage and the reference voltage, and outputs the control voltage via conductor 28. The control voltage controls the gates of pass transistors 12, 14, which in turn control the currents produced by pass transistors 12, 14 to regulate the output voltage at a target output voltage in a similar manner to that which was described with respect to FIG. 1. Capacitor 44 may act as a compensation capacitor for the feedback loop.

Amplifier 40 may generate the control voltage so as to cause the voltage-divided voltage carried by conductor 46 to be substantially equal to the reference voltage carried by reference voltage lead 26 (i.e., amplifier 40 may minimize a difference between the voltage-divided voltage and the reference voltage). The voltage division factor of resistors 48, 50 multiplied by the voltage level of the reference voltage may correspond to the target output voltage level. As such, causing the voltage-divided voltage carried by conductor 46 to be substantially equal to the reference voltage carried by reference voltage lead 26 may cause the output voltage to be regulated at a voltage substantially equal to the target output voltage.

Transistor 54 is a MOSFET transistor, and more specifically a p-type MOSFET (PMOS) transistor, and more specifically a drain extended PMOS (DEPMOS) transistor. As such, transistor 54 is turned on when the voltage carried by conductor 30 is a low voltage, and is turned off when the voltage carried by conductor 30 is a high voltage. When transistor 54 is turned on, transistor 54 forms a current conduction path between the drain of transistor 14 and input voltage lead 22. When transistor 54 is turned off, transistor 54 forms a short circuit between the drain of transistor 14 and input voltage lead 22.

Switch control circuit 20 is configured to turn on transistor 54 when the input voltage of voltage regulator 10 is below a voltage threshold, and to turn off transistor 54 when the input voltage is greater than the voltage threshold. In the example switch control circuit 20 of FIG. 2, the voltage threshold may be greater than the minimum input voltage that is needed to turn on pass transistor 12. This may allow transistor control circuit 16 to continuously control and regulate the gates of pass transistors 14, 16 when pass transistor 14 turns on, thereby preventing voltage spikes from appearing at the voltage output that would otherwise occur due to startup delays in the control loop if the pass transistor 16 were not turned on.

Each of current sources 64, 66 may represent a respective output transistor of a respective current mirror. The sources of the output transistors represented by current sources 64, 66 are coupled to input voltage lead 22. The drain of the output transistor represented by current source 64 is coupled to the cathode of zener diode 62. The drain of the output transistor represented by current source 66 is coupled to the drain of transistor 60 and to the input of inverter 68.

During operation, when the input voltage is below the voltage threshold for turning off transistor 54, zener diode 62 is turned off and therefore does not conduct any current. This causes the output transistor represented by current source 64 to also not conduct any current. The current mirror formed by transistors 58, 60 also does not conduct any current. This causes the output transistor represented by current source 66 to not conduct any current. This pulls the input voltage of inverter 68 up to a voltage that is approximately equal to the input voltage of voltage regulator 10, which may be referred to as a logic high voltage. Inverter 68 receives the logic high voltage, and inverts the logic high voltage to produce a logic low voltage at the output of inverter 68. The low output voltage of inverter 68 causes transistor 54 to turn on, thereby allowing pass transistor 14 to pass current.

When the input voltage is above the voltage threshold, zener diode 62 is turned on and therefore conducts current. This causes the output transistor represented by current source 64 to also conduct current. The current mirror formed by transistors 58, 60 causes current to be conducted through the drain of transistor 60. This causes the output transistor represented by current source 66 to also conduct current. This lowers the input voltage of inverter 68 down to a logic low voltage, which in turn raises the output voltage of inverter 68. The high output voltage of inverter 68 causes transistor 54 to turn off, thereby disconnecting pass transistor 14 from input voltage lead 22.

As shown in FIG. 2, switch control circuit 20 may use zener diode 62 to detect whether the input voltage is greater than or less than a voltage threshold. In this way, switch control circuit 20 may perform voltage detection without requiring the use of a reference voltage-based comparator, thereby reducing the power consumption of voltage regulator 10 and avoiding risks associated with threshold variations in comparator-controlled regulators.

Figure 3:
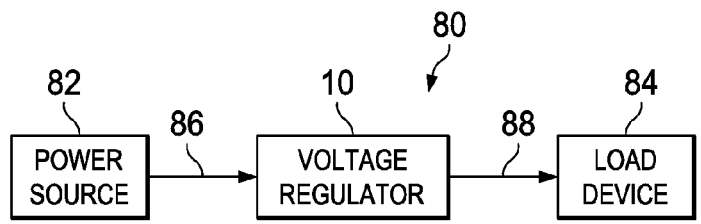
FIG. 3 is a block diagram illustrating an example system that may use the voltage regulators described in FIGS. 1 and 2.

FIG. 3 is a block diagram illustrating an example system 80 that may use the voltage regulators described in FIGS. 1 and 2. System 80 includes a power source 82, a voltage regulator 10, a load device 84, and leads 86, 88. A voltage output of power source 82 is coupled to a voltage input of voltage regulator 10 via lead 86. A voltage output of voltage regulator 10 is coupled to a voltage input of load device 84 via lead 88.

Power source 82 may be any power source including a power grid or mains. Voltage regulator 10 may be either of one the voltage regulators 10 described above with respect to FIGS. 1 and 2 or another type of voltage regulator that incorporates one or more aspects of this disclosure. Load device 84 may be any load device that is powered by power that is supplied by power source 82 as modified by voltage regulator 10. In some examples, load device 84 may be a digital core.

Power source 82 outputs a supply voltage via lead 86. Voltage regulator 10 receives the supply voltage via lead 86, generates a regulated voltage based on the supply voltage, and outputs the regulated voltage via lead 88. Load device 84 receives the regulated voltage via lead 88, and powers one or more components in load device 84 using the regulated voltage.

Figure 4:
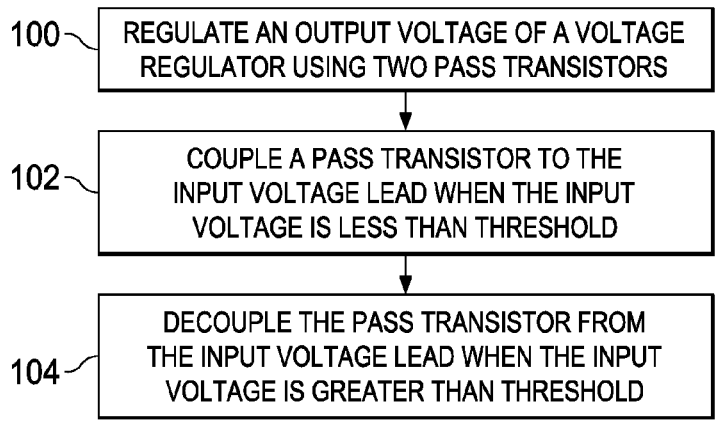
FIG. 4 is a flow diagram illustrating an example technique for regulating a voltage according to this disclosure.

FIG. 4 is a flow diagram illustrating an example technique for regulating a voltage according to this disclosure. The technique shown in FIG. 4 may be implemented in any of the voltage regulators described in this disclosure or in other types of voltage regulators. However, for exemplary purposes, the technique will be described with respect to voltage regulator 10 shown in FIG. 1.

Voltage regulator 10 regulates an output voltage using pass transistors 12, 14 (100). Pass transistor 14 has a turn-on threshold voltage that is less than a turn-on threshold voltage of pass transistor 12. Pass transistor 14 has a maximum drain-to-source voltage rating that is less than maximum drain-to-source voltage rating of pass transistor 12. In some examples, to regulate the output voltage, transistor control circuit 16 may generate a feedback signal based on an output voltage of voltage regulator 10, control pass transistor 12 (e.g., the gate of pass transistor 12) based on the feedback signal, and control pass transistor 14 (e.g., the gate of pass transistor 14) based on the feedback signal.

Switch control circuit 20 may control switch 18 to couple a current path electrode (e.g., drain electrode) of pass transistor 14 to input voltage lead 22 in response to an input voltage carried by the input voltage lead 22 being less than a first threshold (102). Switch control circuit 20 may further control switch 18 to decouple the current path electrode of pass transistor 14 from input voltage lead 22 in response to the input voltage carried by the input voltage lead 22 being greater than the first threshold (104).

In further examples, to regulate the output voltage, transistor control circuit 16 may turn on pass transistor 12 when an input voltage of voltage regulator 10 is greater than a second threshold, and turn off the pass transistor 12 when the input voltage of the voltage regulator is less than the second threshold. In some examples, the second threshold may be less than the first threshold.

In some examples, an integrated circuit designed in accordance with this disclosure includes an input voltage lead 22, an output voltage lead 24, pass transistors 12, 14, and a transistor control circuit 16. Pass transistor 12 has a first current path electrode (e.g., drain electrode) coupled to input voltage lead 22, a second current path electrode (e.g., source electrode) coupled to output voltage lead 24, and a control electrode (e.g., gate electrode). Pass transistor 14 has a first current path electrode (e.g., drain electrode) coupled to input voltage lead 22, a second current path electrode (e.g., source electrode) coupled to output voltage lead 24, and a control electrode (e.g., gate electrode). Transistor control circuit 16 has an input coupled to output voltage lead 24, and an output coupled to the control electrodes (e.g., the gates) of pass transistors 12, 14. Pass transistor 14 has a turn-on threshold voltage that is less than a turn-on threshold voltage of the pass transistor 12. Pass transistor 14 has a maximum drain-to-source voltage rating that is less than a maximum drain-to-source voltage rating of pass transistor 12.

In further examples, the integrated circuit includes a switch 18 having a first current path electrode coupled to input voltage lead 22, a second current path electrode coupled to the first current path electrode (e.g., the drain) of pass transistor 14, and a control electrode. The first current path electrode (e.g., the drain) of pass transistor 14 is coupled to input voltage lead 22 via switch 18.

In additional examples, switch 18 couples the first current path electrode of pass transistor 14 to input voltage lead 22 when switch 18 is operating in an on state, and switch 18 decouples the first current path electrode of pass transistor 14 from input voltage lead 22 when switch 18 is operating in an off state.

In some examples, the integrated circuit further includes a switch control circuit 20 having an input coupled to input voltage lead 22 and an output coupled to the control electrode of switch 18. In such examples, switch control circuit 20 may control, in some examples, switch 18 such that switch 18 couples the first current path electrode of pass transistor 14 to input voltage lead 22 when an input voltage carried by input voltage lead 22 is greater than a threshold. In such examples, switch control circuit 20 may further control switch 18 such that switch 18 decouples the first current path electrode of pass transistor 14 from input voltage lead 22 when the input voltage carried by input voltage lead 22 is less than the threshold.

In some examples, switch control circuit 20 includes a zener diode 62 (FIG. 2) coupled to input voltage lead 22, and a current mirror (transistors 58, 60) having an input transistor (transistor 58) coupled to zener diode 62, and an output transistor (transistor 60) coupled to the control input of switch 18 (via inverter 68).

In additional examples, transistor control circuit 16 includes a feedback circuit 42 and a differential amplifier (e.g., amplifier 40). Feedback circuit 42 has an input coupled to output voltage lead 24, and an output (e.g., node 52). The differential amplifier has a first input coupled to reference voltage lead 26, a second input coupled to the output of feedback circuit 42, and an output coupled to the control electrodes of pass transistors 12, 14.

In some examples, pass transistors 12, 14 have a common conductivity type (e.g., n-type or p-type). In further examples, pass transistors 12, 14 are n-type metal-oxide-semiconductor field effect (NMOS) transistors. In additional examples, pass transistors 12, 14 are drain extended NMOS (DENMOS) transistors.

In some examples, pass transistor 12 includes a back gate electrode that is coupled to a ground conductor 36 for the integrated circuit. In additional examples, pass transistor 14 includes a back gate electrode that is coupled to the second current path electrode (e.g., source electrode) of pass transistor 14.

Although pass transistors 12, 14 are described herein as being DENMOS transistors, pass transistors 12, 14 may be any combination of any type of MOS transistor or other type of transistor with any conductivity type. In some examples, pass transistors 12, 14 may be transistors that have the same conductivity type. In further examples, each of pass transistors 12, 14 may be replaced by any type of voltage-controlled current source having a control electrode that controls a current that flows through two current path electrodes. In the case of a MOSFET transistor, the control electrode may correspond to a gate electrode and the current path electrodes may correspond to the source and drain electrodes. In the case of a bipolar junction transistor (BJT), the control electrode may correspond to a base electrode, and the current path electrodes may correspond to the emitter and collector electrodes. The other transistors in this disclosure may similarly be implemented with different types and/or conductivities of transistors.

The techniques and circuitry described in this disclosure may, in some examples, be implemented on any combination of one or more integrated circuits or other devices. Although illustrative examples have been shown and described by way of example, a wide range of alternative examples are possible within the scope of the foregoing disclosure.

What is claimed is:

1. An integrated circuit comprising:
   an input voltage lead;
   an output voltage lead;
   a first transistor having a first current path electrode coupled to the input voltage lead, a second current path electrode coupled to the output voltage lead, and a control electrode;
   a second transistor having a first current path electrode coupled to the input voltage lead, a second current path electrode coupled to the output voltage lead, and a control electrode; and
   a control circuit having an input coupled to the output voltage lead, and an output coupled to the control electrodes of the first and second transistors,
   in which the second transistor has a turn-on threshold voltage that is less than a turn-on threshold voltage of the first transistor,
   in which the second transistor has a maximum drain-to-source voltage rating that is less than a maximum drain-to-source voltage rating of the first transistor; and
   in which the control circuit regulates an output voltage of a voltage regulator using the first and second transistors.

2. The integrated circuit of claim 1, including:
   a switch having a first current path electrode coupled to the input voltage lead, a second current path electrode coupled to the first current path electrode of the second transistor, and a control electrode, wherein in which the first current path electrode of the second transistor is coupled to the input voltage lead via the switch.

3. The integrated circuit of claim 2, in which the switch couples the first current path electrode of the second transistor to the input voltage lead when the switch is operating in an on state, and in which the switch decouples the first current path electrode of the second transistor from the input voltage lead when the switch is operating in an off state.

4. The integrated circuit of claim 2, in which the control circuit is a first control circuit, the integrated circuit further including: a second control circuit having an input coupled to the input voltage lead and an output coupled to the control electrode of the switch.

5. The integrated circuit of claim 4, in which the second control circuit controls the switch such that the switch couples the first current path electrode of the second transistor to the input voltage lead when the input voltage carried by the input voltage lead is greater than a threshold, and in which the second control circuit further controls the switch such that the switch decouples the first current path electrode of the second transistor from the input voltage lead when the input voltage carried by the input voltage lead is less than the threshold.

6. The integrated circuit of claim 4, in which the second control circuit includes:
   a zener diode coupled to the input voltage lead; and
   a current mirror having an input transistor coupled to the zener diode, and an output transistor coupled to the control input of the switch.

7. The integrated circuit of claim 1, in which the control circuit includes:
   a feedback circuit having an input coupled to the output voltage lead, and an output; and
   a differential amplifier having a first input coupled to a reference voltage lead, a second input coupled to the output of the feedback circuit, and an output coupled to the control electrodes of the first and second transistors.

8. The integrated circuit of claim 1, in which the first and second transistors are n-type metal-oxide-semiconductor field effect (NMOS) transistors.

9. The integrated circuit of claim 8, in which the first and second transistors are drain extended NMOS (DENMOS) transistors.

10. The integrated circuit of claim 9, in which the first transistor further includes a back gate electrode that is coupled to a ground electrode of the integrated circuit.

11. The integrated circuit of claim 10, in which the second transistor further includes a back gate electrode that is coupled to the second current path electrode of the second transistor.

12. A process comprising:
    regulating an output voltage of a voltage regulator using first and second pass transistors, the second pass transistor having a turn-on threshold voltage that is less than a turn-on threshold voltage of the first pass transistor, the second pass transistor having a maximum drain-to-source voltage rating that is less than maximum drain-to-source voltage rating of the first pass transistor.

13. The process of claim 12, in which regulating the output voltage includes:
    generating a feedback signal based on an output voltage of the voltage regulator;
    controlling the first pass transistor based on the feedback signal; and
    controlling the second pass transistor based on the feedback signal.

14. The process of claim 12, including:
    coupling a current path electrode of the second transistor to an input voltage lead of the voltage regulator in response to an input voltage carried by the input voltage lead being less than a threshold; and
    decoupling the current path electrode of the second transistor from the input voltage lead of the voltage regulator in response to the input voltage carried by the input voltage lead being greater than the threshold.

15. The process of claim 14, in which the threshold is a first threshold, the process including:
    turning on the first pass transistor when an input voltage of the voltage regulator is greater than a second threshold; and
    turning off the first pass transistor when the input voltage of the voltage regulator is less than the second threshold.

16. The process of claim 14, in which the first transistor includes a back gate electrode that is coupled to a ground electrode for the integrated circuit, and the second transistor includes a back gate electrode that is coupled to a source electrode of the second transistor.

17. A device comprising circuitry configured to:
  regulate an output voltage of a voltage regulator using first and second pass transistors, the second pass transistor having a turn-on threshold voltage that is less than a turn-on threshold voltage of the first pass transistor, the second pass transistor having a maximum drain-to-source voltage rating that is less than maximum drain-to-source voltage rating of the first pass transistor.

18. The device of claim 17, in which the circuitry is further configured to:
  generate a feedback signal based on an output voltage of the voltage regulator;
  control the first pass transistor based on the feedback signal; and
  control the second pass transistor based on the feedback signal.

19. The device of claim 17, in which the circuitry is further configured to:
  couple a current path electrode of the second transistor to an input voltage lead of the voltage regulator in response to an input voltage carried by the input voltage lead being less than a threshold; and
  decouple the current path electrode of the second transistor from the input voltage lead of the voltage regulator in response to the input voltage carried by the input voltage lead being greater than the threshold.

20. The device of claim 19, in which the threshold is a first threshold, and wherein the circuitry is further configured to:
  turn on the first pass transistor when an input voltage of the voltage regulator is greater than a second threshold; and
  turn off the first pass transistor when the input voltage of the voltage regulator is less than the second threshold.

* * * * *